(12) United States Patent
Oh et al.

(10) Patent No.: US 8,976,601 B2
(45) Date of Patent: Mar. 10, 2015

(54) SEMICONDUCTOR MEMORY APPARATUS

(75) Inventors: Sung Lae Oh, Icheon-si (KR); Byung Sub Nam, Icheon-si (KR); Go Hyun Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 438 days.

(21) Appl. No.: 13/480,675

(22) Filed: May 25, 2012

(65) Prior Publication Data

US 2012/0307544 A1 Dec. 6, 2012

(30) Foreign Application Priority Data

May 31, 2011 (KR) .................. 10-2011-0052245
Apr. 23, 2012 (KR) .................. 10-2012-0042120

(51) Int. Cl.
*G11C 11/34* (2006.01)
*G11C 16/04* (2006.01)
*G11C 16/06* (2006.01)
*G11C 16/34* (2006.01)

(52) U.S. Cl.
CPC ............ *G11C 16/0483* (2013.01); *G11C 16/06* (2013.01); *G11C 16/3427* (2013.01)
USPC ...... 365/185.25; 365/174; 365/203; 365/198; 365/189.15

(58) Field of Classification Search
USPC ................ 365/174, 203, 185.25, 198, 189.15
See application file for complete search history.

(56) References Cited

U.S. PATENT DOCUMENTS

2004/0037123 A1* 2/2004 Khang .......................... 365/200
2007/0019468 A1* 1/2007 Seong et al. ............. 365/185.03

* cited by examiner

*Primary Examiner* — Han Yang
(74) *Attorney, Agent, or Firm* — William Park & Associates Patent Ltd.

(57) ABSTRACT

A semiconductor memory apparatus includes a boundary circuit unit positioned between a low voltage page buffer and a high voltage page buffer and having circuits configured to electrically couple the low voltage page buffer and the high voltage page buffer. The boundary circuit unit includes: a first boundary circuit unit having first and second transistors configured to receive data of a corresponding memory cell area through a signal transmission line selected from a plurality of signal transmission lines extended and arranged along a first direction for each column; a second boundary circuit unit disposed adjacent in the first direction from the first boundary circuit unit and having the plurality of signal transmission lines extended and arranged thereon; and an active region where the first transistor is formed and an active region where the second transistor is formed are isolated from each other.

17 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean application numbers 10-2011-0052245 and 10-2012-0042120, filed on May 31, 2011 and Apr. 23, 2012, respectively, in the Korean Intellectual Property Office, which is incorporated herein by reference in its entirety.

BACKGROUND

1. Technical Field

The present invention relates generally to a semiconductor integrated circuit, and more particularly to a page buffer structure of a semiconductor memory apparatus.

2. Related Art

With the development of a mobile system, demand for semiconductor memory devices such as nonvolatile memory devices increases.

A flash memory device which is a nonvolatile memory device capable of electrically erasing and programming data may maintain data even in absence of power supply. Furthermore, the flash memory device has low power consumption and high access time characteristics.

The flash memory device is divided into a NOR type and a NAND type depending on the configuration of cells and bit lines. In particular, since the NAND flash memory device has a string structure in which a plurality of cell transistors are coupled in series to a bit line, the NAND flash memory may store a large amount of data in a relatively small area.

However, with the trend of high capacity and high integration, the flash memory device also has many limits on a cell area and a chip size.

SUMMARY

A semiconductor memory apparatus capable of improving a page buffer process margin is described herein.

In an embodiment of the present invention, a semiconductor memory apparatus includes a boundary circuit unit positioned between a low voltage page buffer and a high voltage page buffer and having circuits integrated therein, the circuits configured to electrically couple the low voltage page buffer and the high voltage page buffer. The boundary circuit unit includes: a first boundary circuit unit having first and second transistors integrated therein, the first and second transistors configured to receive data of a corresponding memory cell area through a signal transmission line selected from a plurality of signal transmission lines extended and arranged along a first direction for each column; and a second boundary circuit unit disposed adjacent in the first direction from the first boundary circuit unit and having the plurality of signal transmission lines extended and arranged thereon, and an active region where the first transistor is formed and an active region where the second transistor is formed are isolated from each other.

In an embodiment of the present invention, a semiconductor memory apparatus includes: a first boundary circuit unit having first and second transistors integrated therein, the first and second transistors configured receive data of a corresponding memory cell area through a selected signal transmission line among a plurality of signal transmission lines extended in a first direction for each column; and a second boundary circuit unit having the plurality of signal transmission lines arranged thereon and extended to the first boundary circuit unit and including a plurality of upper interconnections overlapped over the plurality of signal transmission lines. The selected signal transmission line includes a first portion coupled to a source of the first transistor and a second portion coupled to a source of the second transistor, the first portion is positioned over a column corresponding to the selected signal transmission line, the second portion is positioned over a column where a signal transmission line adjacent to the selected signal transmission line is to be positioned such that the selected signal transmission line has a bent shape, and the signal transmission line positioned in the adjacent column includes a cut portion to house the second portion of the selected signal transmission line.

In an embodiment of the present invention, a semiconductor memory apparatus includes: a plurality of interconnection formation regions spaced at even distances from each other; and an interconnection including a first region disposed over a corresponding interconnection formation region and a second area disposed in a space between the corresponding interconnection formation region and another interconnection formation region adjacent thereto.

BRIEF DESCRIPTION OF THE DRAWINGS

Features, aspects, and embodiments are described in conjunction with the attached drawings, in which.

DETAILED DESCRIPTION

Figure 1:
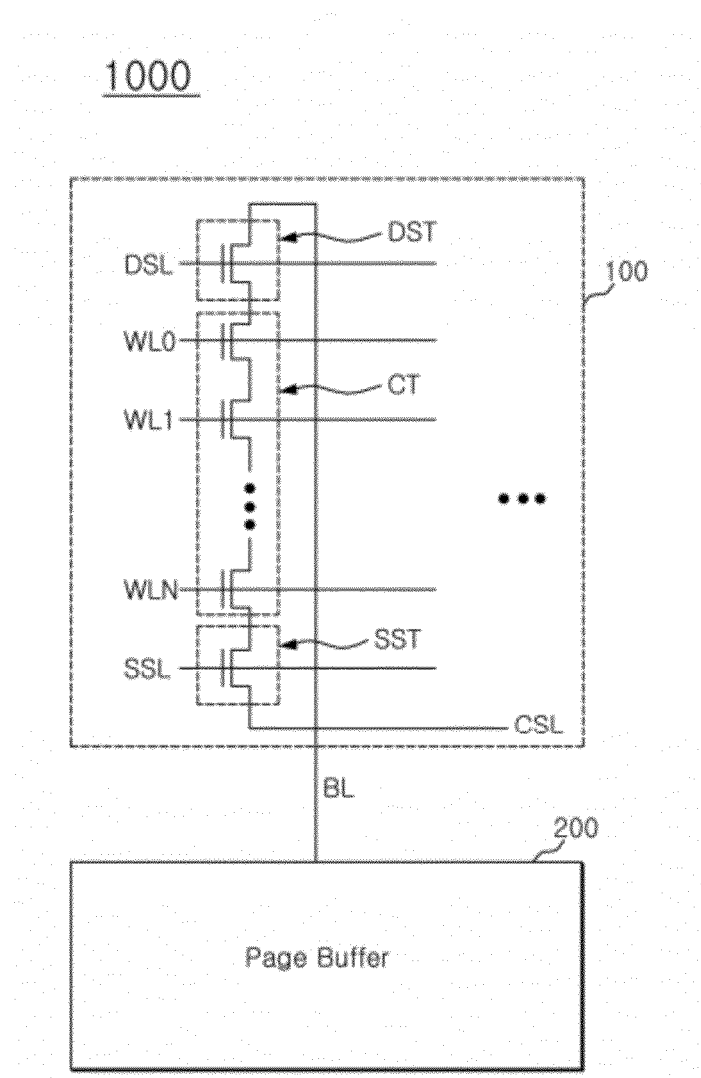
FIG. 1 is a circuit diagram illustrating a unit cell structure of a semiconductor memory apparatus according to an embodiment of the present invention.

Hereinafter, a semiconductor memory apparatus and a semiconductor integrated circuit having the same according to the present invention will be described below with reference to the accompanying drawings through exemplary embodiments.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Referring to FIG. 1, a semiconductor memory apparatus 1000 according to an embodiment of the present invention may include a memory cell string 100 and a page buffer 200. The memory cell string 100 may include a drain select transistor DST, a plurality of cell transistors CT, and a source select transistor SST.

The drain select transistor DST is configured to transmit a signal of a bit line BL toward the cell transistors CT in response to a drain select signal DSL.

The plurality of cell transistors CT are configured to selectively store data transmitted through the drain select transistor DST in response to a plurality of word line signals WL<0:N>.

The source select transistor SST is configured to transmit data transmitted from the cell transistors CT to a common source line CSL in response to a source select signal SSL.

Here, the drain select transistor DST, the cell transistors CT, and the source select transistors SST may be coupled in series.

The page buffer 200 is configured to temporarily store a predetermined amount of data during a read or write operation. The page buffer 200 may be coupled to the bit line BL. For example, the page buffer 200 may be coupled to the bit line BL through interconnections. Here, the bit line BL may be positioned for each column of a memory cell group, and the page buffer 200 may be one-to-one coupled to the bit line BL.

Figure 2:
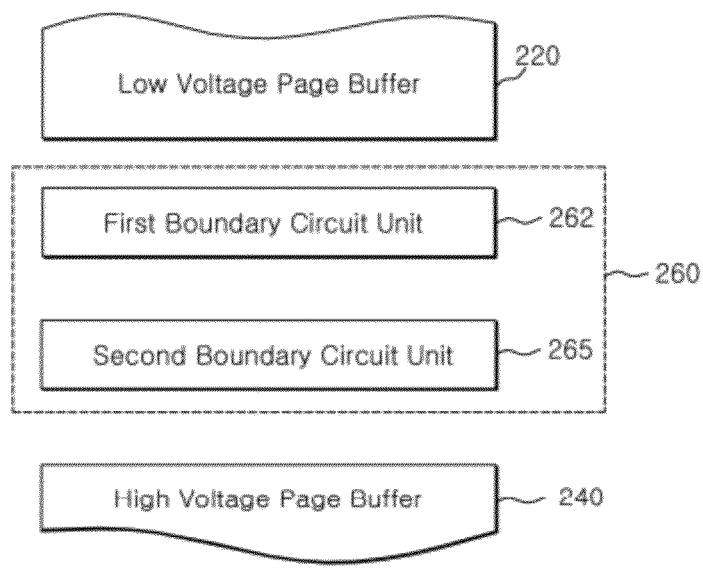
FIG. 2 is a block diagram illustrating a page buffer of the semiconductor memory apparatus according to an embodiment of the present invention.

Referring to FIG. 2, the page buffer 200 may include a high voltage page buffer 240, a low voltage page buffer 220, and a boundary circuit unit 260.

The high voltage page buffer 240 serves to float the bit line BL through an erase operation. The high voltage page buffer 240 allows the bit line BL to float by applying a high-voltage erase bias. The memory cell string 100 may be arranged closer to the high voltage page buffer 240 than the low voltage page buffer 220, in order to allow the bit line BL to float stably.

The low voltage page buffer 220 may apply a reverse bias during the erase operation so that the bit line BL floats.

The boundary circuit unit 260 may be formed between the low voltage page buffer 220 and the high voltage page buffer 240. The boundary circuit unit 260 may include interconnections and circuit elements for coupling the low voltage page buffer 220 and the high voltage page buffer 240.

Figure 3:
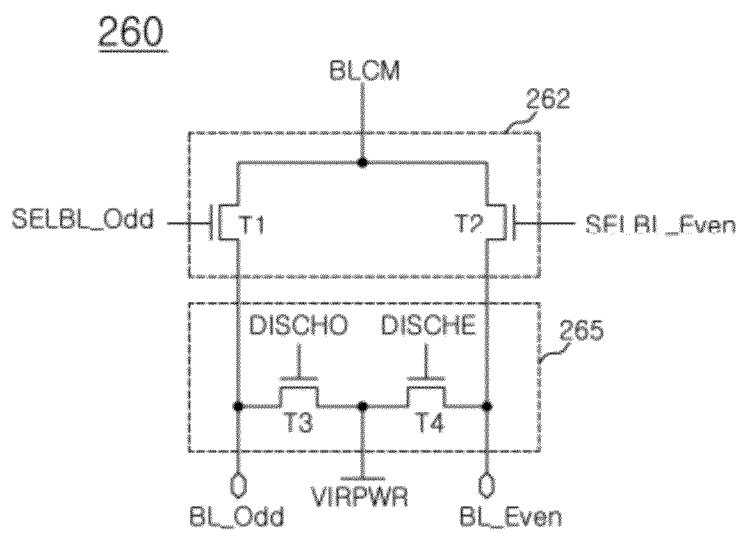
FIG. 3 is a detailed circuit diagram of a boundary circuit unit of FIG. 2.

Referring to FIGS. 2 and 3, the boundary circuit unit 260 may include a first boundary circuit unit 262 and a second boundary circuit unit 265.

The first boundary circuit unit 262 may include a first transistor T1 and a second transistor T2.

The first transistor T1 has a gate configured to receive an odd bit line select signal SELBL_Odd, a drain coupled to a signal transmission line BLCM, and a source coupled to an odd bit line BL_Odd. Here, the signal transmission line BLCM may be coupled to the low voltage page buffer 220.

The second transistor T2 has a gate configured to receive an even bit line select signal SELBL_Even, a drain coupled to the signal transmission line BLCM, and a source coupled to an even bit line BL_Even.

The signal transmission line BLCM may be a signal line coupled to the corresponding page buffer 200. For example, the signal transmission line BLCM may include the bit line coupled to the corresponding page buffer 200.

The second boundary circuit unit 265 may include third and fourth transistors T3 and T4. The third transistor T3 is driven in response to an odd discharge signal DISCHO, and coupled between the odd bit line BL_Odd and the fourth transistor T4. The fourth transistor T4 is driven in response to an even discharge signal DISCHE, and coupled between the third transistor T3 and the even bit line BL_Even. A coupling node between the third and fourth transistors T3 and T4 is coupled to a power supply voltage terminal VIRPWR.

Here, the drains of the first and third transistors T1 and T3 may be commonly formed, and the drains of the second and fourth transistors T2 and T4 may also be commonly formed.

Figure 4:
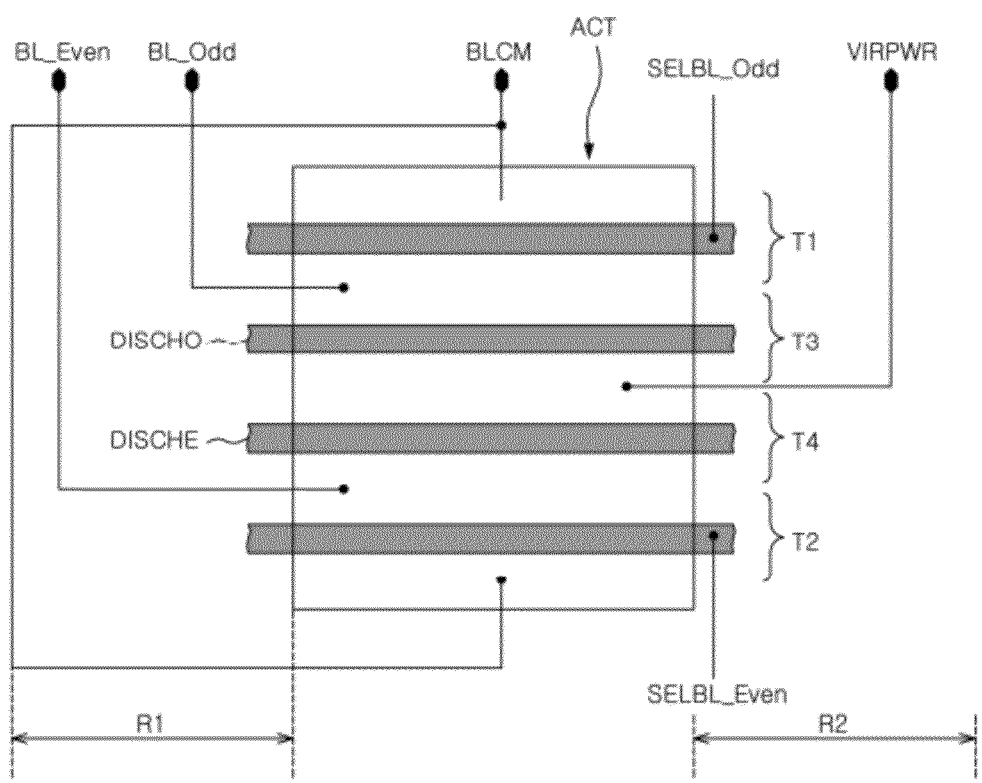
FIG. 4 is a layout diagram of a known boundary circuit unit.

In a known semiconductor memory apparatus, the first and second boundary circuit units 262 and 265 are integrated in one active region ACT, for example. Referring to FIG. 4, the first transistor T1, the third transistor T3, the fourth transistor T4, and the second transistor T2 may be sequentially arranged on the active region ACT. According to an example, the odd bit line BL_Odd, the even bit line BL_Even, and the power supply voltage lines VIRPWR are arranged along the edge of the active region ACT. However, when the bit lines and the signal lines are arranged along the edge of the active region ACT, additional interconnection areas as indicated by R1 and R2 of FIG. 4 may be required. Therefore, an effective area of the high voltage page buffer may be increased.

In an embodiment of the present invention, the entire layout area of the page buffer 200 may be reduced by changing the design of the boundary circuit unit 260 coupling the low voltage buffer 220 and the high voltage buffer 240.

Figure 5:
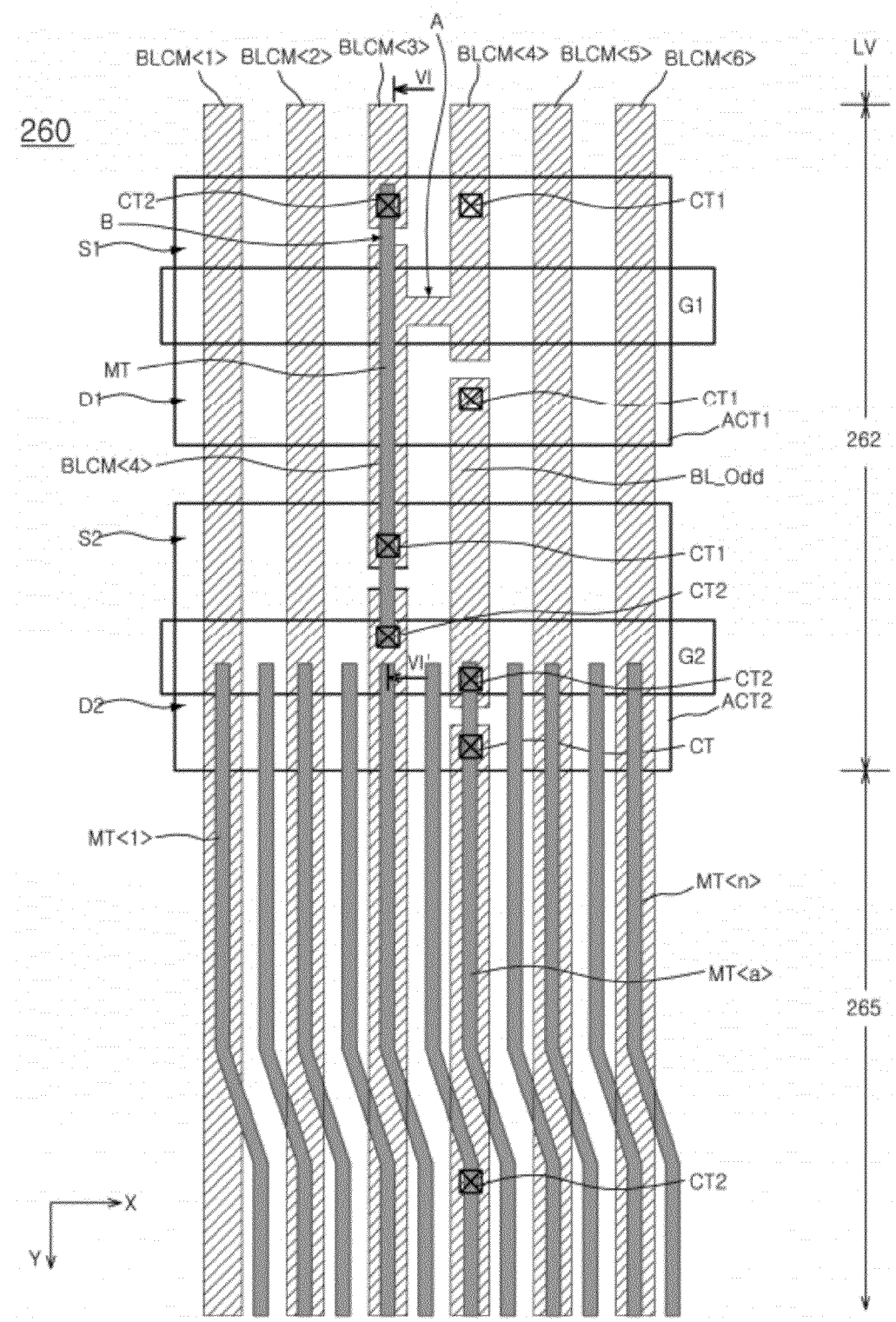
FIG. 5 is a layout diagram of a boundary circuit unit according to an embodiment of the present invention.

Referring to FIG. 5, a first active region ACT1 and a second active region ACT2 are arranged on the first boundary circuit unit 262, with a predetermined distance provided therebetween along a Y-direction of FIG. 5. A first gate G1 is extended over the first active region ACT1 along an X-direction of FIG. 5, and a source S1 and a drain D1 are formed by implanting ion impurities into the first active region ACT1 in both sides of the first gate G1. In this way, the first transistor T1 is formed.

A second gate G2 is formed over the second active region ACT2 along the X-direction, and a source S2 and a drain D2 are formed by implanting ion impurities into the second area ACT2 in both sides of the second gate G2. In this way, the second transistor T2 is formed. The first and second gates G1 and G2 may be extended in parallel to each other.

The odd bit line BL_Odd is coupled to the drain of the first transistor T1, and extended in the Y-direction crossing the first and second gates G1 and G2. The odd bit line BL_Odd is disposed on a predetermined area of the active region ACT1. The even bit line BL_Even is extended in the Y-direction while contacting with the drain D2 of the second transistor T2. The even bit line BL_Even may be formed across the first and second boundary circuit units 262 and 265, or may be formed along the odd bit line BL_Odd. According to an example, the even bit line BL_Even may be disposed on the same line as the corresponding odd bit line BL_Odd.

A plurality of signal transmission lines BLCM<1:6> are extended over the first and second boundary circuit units 262 and 265 in the Y-direction, with a predetermined distance provided therebetween. That is, the plurality of signal transmission lines BLCM<1:6> may be extended in parallel to each other for each column, like bit lines of a memory cell array.

When it is assumed that the boundary circuit unit 260 according to an embodiment of the present invention is coupled to the fourth signal transmission line BLCM<4> related to a fourth bit line, the fourth signal transmission line BLCM<4> should be coupled to the source S1 of the first transistor T1 and the source S2 of the second transistor T2. The other signal transmission lines BLCM<1, 2, 3, 5, 6> excluding the fourth signal transmission line BLCM<4> may be extended without electrical contacts with the boundary circuit unit 260. Here, since a plurality of page buffers 200 are sequentially arranged along the Y-direction of FIG. 5, the signal transmission lines BLCM<1:6> are arranged at even distances in the Y-direction, and selectively coupled to the corresponding page buffers 200.

For example, the odd bit line BL_Odd and the even bit line BL_Even of the page buffer 200 coupled to the fourth signal transmission line BLCM<4> may be disposed in a region (column) where the fourth signal transmission line BLCM<4> is to be formed. The fourth signal transmission line BLCM<4> may be bent toward an adjacent signal transmission line, in order to secure the region of the odd bit line BL_Odd and the even bit line BL_Even.

The fourth signal bit line BLCM<4> may include a first portion coupled to the source S1 of the first transistor T1 and a second portion coupled to the source S2 of the second transistor T2. The first portion may be formed in the region where the fourth signal transmission line BLCM<4> is to be formed, and the second portion may be formed in a region where a signal transmission line adjacent to the fourth signal transmission line BLCM<4>, for example, the third signal transmission line BLCM<3> is to be formed. Accordingly, the fourth signal transmission line BLCM<4> has a bent shape due to a coupling portion A which couples the first and second portions. Furthermore, the fourth signal transmission line BLCM<4> serves to transmit data of corresponding bit line to the sources S1 and S2 of the first and second transistors. Therefore, when the fourth signal transmission line BLCM<4> is coupled to the sources S1 and S2 of the first and second transistors formed in the isolated active regions ACT1 and ACT2, the fourth signal transmission line BLCM<4> does not need to be extended in the Y-direction.

Figure 6:
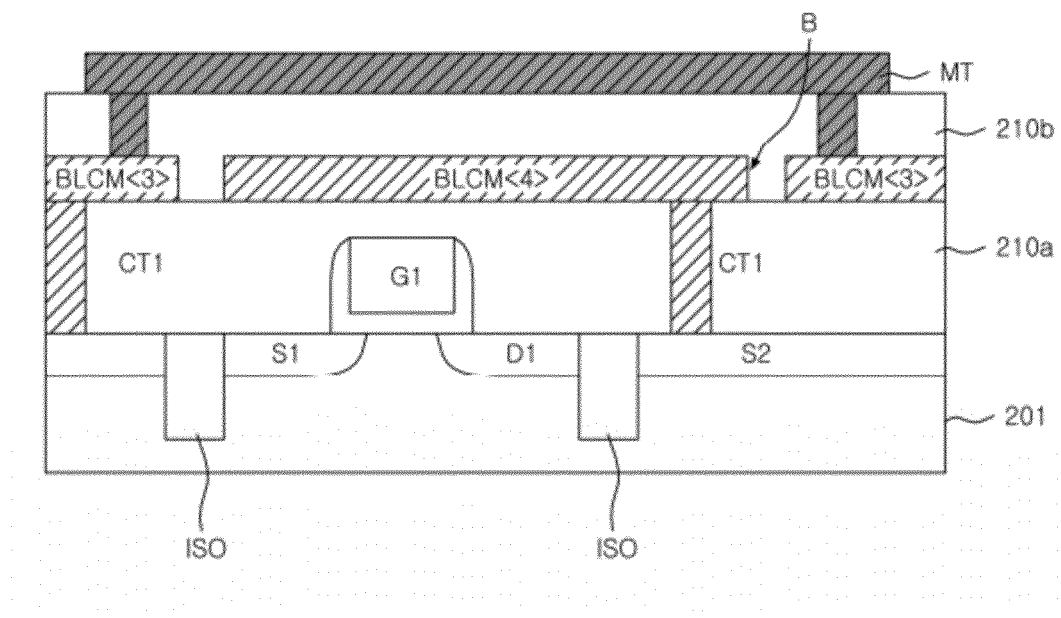
FIG. 6 is a cross-sectional view taken along a line VI-VI' of FIG. 5.

In order to form the fourth signal transmission line BLCM<4>, the third signal transmission line BLCM<3> may have a cut portion B formed in regions corresponding to the first and second active regions ACT1 and ACT2 of the boundary circuit unit 260, respectively, as illustrated in FIGS. 5 and 6. That is, the cut portion B is formed in the third signal transmission line BLCM<3>, in order to locate the bent portion of the fourth signal transmission line BLCM<4>. Although the third signal transmission line BLCM<3> is cut by the cut portion B, the third signal transmission line BLCM<3> is electrically coupled through an upper metal interconnection MT. Accordingly, an electrical signal can be transmitted through the upper metal interconnection MT.

Here, reference numeral 201 represents a semiconductor substrate, and reference numerals 210a and 210b represent interlayer dielectric layers. Furthermore, symbol ISO represents an isolation layer, symbol CT1 represents a bottom contact, and symbol CT2 represents a top contact.

The fourth signal transmission line BLCM<4> according to an embodiment of the present invention, that is, a select signal transmission line which is electrically coupled to the corresponding page buffer 200 among the plurality of signal transmission lines may be positioned, for example, only in the corresponding boundary circuit unit 260, as the active regions ACT1 and ACT2 forming the first and second boundary circuit units 262 and 265 are isolated. Furthermore, odd and even bit lines may be integrated in the region where the select signal transmission line is to be formed. Accordingly, most signal interconnections used for the page buffer may be integrated on the active regions.

A plurality of upper metal interconnections MT<0:n> are extended over the second boundary circuit unit 265 in the Y-direction, with a predetermined distance provided therebetween. The upper metal interconnections may also be positioned over the first boundary circuit unit 262. For convenience of description, however, only a modified upper metal interconnection MT is illustrated. Since the other interconnections may have the same shape as general interconnections, the detailed descriptions thereof will be omitted herein. Each of the upper metal interconnections MT<0:n> may electrically couple an element formed in the first boundary circuit unit 262 to an element formed in the second boundary circuit unit 265. An upper metal interconnection MT<a> coupled to the signal transmission line BLCM<5> coupled to the corresponding page buffer 200 is coupled to the drain D2 of the second transistor T2.

Each of the upper metal interconnections MT<1:n> formed in the second boundary circuit unit 265 includes a first portion and a second portion bent and extended from the first portion. The first portion of the upper metal interconnection MT<1:n> may be disposed over a corresponding signal transmission line or in a space between adjacent signal transmission lines. For example, the first portion of an odd upper metal interconnection MT<1:n> may be positioned over a signal transmission line, and the first portion of an even upper metal interconnection MT<1:n> may be positioned in a space between adjacent signal transmission lines.

The second portion of the upper metal interconnection MT<1:n> may be disposed in a space between signal transmission lines or over a signal transmission line. For example, the second portion of an odd upper metal interconnection MT<1:n> may be positioned between signal transmission lines, and the second portion of an even upper metal interconnection MT<1:n> may be positioned over a signal transmission line.

An end of the first portion of the upper metal interconnection MT<1:n> may be positioned over the second gate G2. Furthermore, the upper metal interconnection MT<1:n> may be electrically coupled to a signal transmission line positioned thereunder through a top contact CT2.

An upper metal interconnection MT may be overlapped over a signal transmission line BLCM with a dielectric layer interposed therebetween. In an embodiment of the present invention, the upper metal interconnection MT<1:n> may be disposed in a bent shape over a signal transmission line or in a space between signal transmission lines. Therefore, the space between the signal transmission lines may be used as an interconnection formation space. Accordingly, it is possible to improve the interconnection margin.

According to an embodiment of the present invention, as the active region formed in the boundary circuit unit is separated, a line for transmitting a signal of a bit line does not need to be extended in the column direction. Furthermore, interconnections may be integrated in a region where the line for transmitting the signal of the bit line is to be formed. Furthermore, as the upper metal interconnection is formed in such a bent shape as to be positioned over a signal transmission line or in a space between signal transmission lines, the interconnection margin may be improved.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising a boundary circuit unit positioned between a low voltage page buffer and a high voltage page buffer and having circuits configured to electrically couple the low voltage page buffer and the high voltage page buffer, wherein the boundary circuit unit comprises:
 a first boundary circuit unit comprising first and second transistors configured to receive data of a corresponding memory cell area through a signal transmission line selected from a plurality of signal transmission lines extended and arranged along a first direction for each column; and a second boundary circuit unit disposed adjacent in the first direction from the first boundary circuit unit and having the plurality of signal transmission lines extended and arranged thereon, and an active region where the first transistor is formed and an active region where the second transistor is formed are isolated from each other.

2. The semiconductor memory apparatus according to claim 1, wherein the first boundary circuit unit comprises:

first and second active regions arranged at a predetermined distance from each other along the first direction;

a first transistor arranged over the first active region and having a first gate, disposed in a second direction crossing the first direction, and a first source and a first drain arranged in the first active region in both sides of the first gate;

a second transistor arranged over the second active region and having a second gate, extended in the second direction, and a second source and a second drain arranged in the second active region in both sides of the second gate.

3. The semiconductor memory apparatus according to claim 2, further comprising:

an odd bit line electrically coupled to the first drain; and
an even bit line electrically coupled to the second drain,
wherein the odd bit line and the even bit line are arranged over the first and second boundary circuit units in parallel to the signal transmission line.

4. The semiconductor memory apparatus according to claim 3, wherein the odd bit line and the even bit line are arranged on the same line, and electrically insulated from each other.

5. The semiconductor memory apparatus according to claim 3, wherein the odd bit line and the even bit line are positioned in a column where the selected signal transmission line is to be formed, and a first portion of the selected signal transmission line is positioned in the prearranged column, and a second portion of the selected signal transmission line is bent to be positioned in an adjacent column.

6. The semiconductor memory apparatus according to claim 5, wherein a signal transmission line positioned in the adjacent column comprises a cut portion to be isolated from the selected signal transmission line, and a portion of the signal transmission line positioned in the adjacent column electrically is coupled to another portion of the signal transmission line positioned in the adjacent column through an upper conductive interconnection formed over the signal transmission line.

7. The semiconductor memory apparatus according to claim 6, wherein the second boundary circuit unit further comprises a plurality of upper interconnections positioned over the plurality of signal transmission lines.

8. The semiconductor memory apparatus according to claim 7, wherein the plurality of upper interconnections and the upper conductive interconnection are positioned on the same level.

9. The semiconductor memory apparatus according to claim 7, wherein each of the upper interconnections has a first portion and a second portion, the first portion and a corresponding signal transmission line overlap one another, the second portion is disposed in a space between the corresponding signal transmission line and another signal transmission line adjacent thereto; and a bent portion is formed between the first portion and the second portion.

10. A semiconductor memory apparatus comprising:

a first boundary circuit unit comprising first and second transistors configured receive data of a corresponding memory cell area through a selected signal transmission line among a plurality of signal transmission lines extended in a first direction for each column; and a second boundary circuit unit having the plurality of signal transmission lines arranged thereon and extended to the first boundary circuit unit and comprising a plurality of upper interconnections overlapped over the plurality of signal transmission lines, wherein the selected signal transmission line comprises a first portion coupled to a source of the first transistor and a second portion coupled to a source of the second transistor, the first portion is positioned over a column corresponding to the selected signal transmission line, the second portion is positioned over a column where a signal transmission line adjacent to the selected signal transmission line is to be positioned such that the selected signal transmission line has a bent shape, and the signal transmission line positioned in the adjacent column comprises a cut portion to be isolated from the second portion of the selected signal transmission line.

11. The semiconductor memory apparatus according to claim 10, wherein an active region where the first transistor is formed and an active region where the second transistor is formed are arranged at a predetermined distance from each other along the first direction.

12. The semiconductor memory apparatus according to claim 10, further comprising:

an odd bit line electrically coupled to a drain of the first transistor; and an even bit line electrically coupled to a drain of the second transistor, wherein the odd bit line and the even bit line are extended and arranged over the first and second boundary circuit units along the first direction.

13. The semiconductor memory apparatus according to claim 12, wherein the odd bit line and the even bit line are arranged on the same line, and electrically insulated from each other.

14. The semiconductor memory apparatus according to claim 13, wherein the first portion of the selected signal transmission line is disposed in a straight line shape.

15. The semiconductor memory apparatus according to claim 10, wherein a portion of the signal transmission line positioned in the adjacent column electrically is coupled to another portion of the signal transmission line positioned in the adjacent column through an upper conductive interconnection formed over the signal transmission line.

16. The semiconductor memory apparatus according to claim 15, wherein the plurality of upper interconnections and the upper conductive interconnection are positioned on the same level.

17. The semiconductor memory apparatus according to claim 10, wherein each of the upper interconnections has a first portion and a second portion, the first portion and a corresponding signal transmission line overlap one another, the second portion is disposed in a space between the corresponding signal transmission line and another signal transmission line adjacent thereto, and a bent portion is formed between the first portion and the second portion.

* * * * *